United States Patent
Yang et al.

(10) Patent No.: US 10,014,340 B2
(45) Date of Patent: Jul. 3, 2018

(54) STACKED SPAD IMAGE SENSOR

(71) Applicant: Taiwan Semiconductor Manufacturing Co., Ltd., Hsin-Chu (TW)

(72) Inventors: Ming-Hsien Yang, Taichung (TW);
Ching-Chun Wang, Tainan (TW);
Dun-Nian Yaung, Taipei (TW);
Feng-Chi Hung, Chu-Bei (TW);
Shyh-Fann Ting, Tainan (TW);
Chun-Yuan Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/980,386

(22) Filed: Dec. 28, 2015

(65) Prior Publication Data
US 2017/0186798 A1 Jun. 29, 2017

(51) Int. Cl.
*H01L 27/146* (2006.01)
*H01L 31/0352* (2006.01)
*H01L 31/107* (2006.01)

(52) U.S. Cl.
CPC .... *H01L 27/14634* (2013.01); *H01L 27/1462* (2013.01); *H01L 27/14612* (2013.01); *H01L 27/14629* (2013.01); *H01L 27/14632* (2013.01); *H01L 27/14636* (2013.01); *H01L 27/14687* (2013.01); *H01L 31/03529* (2013.01); *H01L 31/107* (2013.01)

(58) Field of Classification Search
CPC ........... H01L 27/14634; H01L 27/1462; H01L 27/14636; H01L 27/14687; H01L 27/14632; H01L 27/14612; H01L 27/14629; H01L 31/107
See application file for complete search history.

(56) References Cited

U.S. PATENT DOCUMENTS

| | | | |
|---|---|---|---|
| 2010/0019295 A1 | 1/2010 | Henderson et al. | |
| 2013/0193546 A1 | 8/2013 | Webster et al. | |
| 2015/0200222 A1* | 7/2015 | Webster | H01L 31/107 250/208.1 |

(Continued)

OTHER PUBLICATIONS

Borghetti, et al. "A CMOS Single-Photon Avalanche Diode Sensor for Fluorescence Lifetime Imaging." Sensors Journal, IEEE (vol. 9, Issue: 9 ), Sep. 2009.

*Primary Examiner* — Brigitte Paterson
(74) *Attorney, Agent, or Firm* — Eschweiler & Potashnik, LLC (57) ABSTRACT

The present disclosure relates to a stacked SPAD image sensor with a CMOS Chip and an imaging chip bonded together, to improve the fill factor of the SPAD image sensor, and an associated method of formation. In some embodiments, the imaging chip has a plurality of SPAD cells disposed within a second substrate. The CMOS Chip has a first interconnect structure disposed over a first substrate. The imaging chip has a second interconnect structure disposed between the second substrate and the first interconnect structure. The CMOS Chip and the imaging chip are bonded together through along an interface disposed between the first interconnect structure and the second interconnect structure.

20 Claims, 9 Drawing Sheets

(56) References Cited

U.S. PATENT DOCUMENTS

| | | | | |
|---|---|---|---|---|
| 2015/0200314 A1* | 7/2015 | Webster | ............ | H01L 27/14612 |
| | | | | 250/208.1 |
| 2015/0333210 A1* | 11/2015 | Teva | ............... | H01L 31/022408 |
| | | | | 257/438 |
| 2016/0104740 A1* | 4/2016 | Kim | .................. | H01L 27/14645 |
| | | | | 257/292 |

\* cited by examiner

STACKED SPAD IMAGE SENSOR

BACKGROUND

Digital cameras and optical imaging devices employ image sensors. Image sensors convert optical images to digital data that may be represented as digital images. An image sensor typically includes an array of pixel sensors, which are unit devices for the conversion of an optical image into electrical signals. Pixel sensors often manifest as charge-coupled devices (CCDs) or complementary metal oxide semiconductor (CMOS) devices.

Avalanche photodiodes (APD) are solid devices that are compatible with traditional CMOS devices. An avalanche process can be triggered when a reverse biased p-n junction receives additional carriers, such as carriers generated by incident radiation. For example, in order to detect radiations with low intensities, the p-n junction is biased above its breakdown voltage, thereby allowing a single photon-generated carrier to trigger an avalanche current that can be detected. Image sensor operated in this mode is known as a single photon avalanche diode (SPAD) image sensor, or a Geiger-mode avalanche photodiodes or G-APD.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A SPAD (single photon avalanche diode) image sensor can detect incident radiation with very low intensities (e.g., a single photon). The SPAD image sensor includes a plurality of SPAD cells arranged in an array. The SPAD cells respectively include a p-n junction, a quench circuit and a read circuit. The p-n junction operates at a reverse bias well above its breakdown voltage. During operation, photo-generated carriers move to a depletion region (i.e., a multiplication region) of the p-n junction and trigger an avalanche effect such that a signal current can be detected. The quench circuit is used to cut off the avalanche effect and reset the SPAD cell. The read circuit receives and transmits the signal current.

Traditionally, a SPAD image sensor is fabricated within one substrate. The p-n junctions and associated circuits are arranged in lateral and are compatible to CMOS fabrication processes. For example, the p-n junction may be arranged at a position that is laterally offset from the quench circuit. However, this arrangement consumes a large area of the substrate and limits further scaling. Furthermore, this arrangement results in a small fill factor, a parameter characterizing a ratio of photodiode area to total pixel area, due to occupancy of the associated circuits.

The present disclosure relates to a stacked SPAD image sensor comprising a CMOS chip and an imaging chip bonded together, to improve the fill factor of the SPAD image sensor, and an associated method of formation. In some embodiments, the imaging chip comprises a plurality of SPAD cells disposed within a second substrate. The CMOS chip comprises a first interconnect structure disposed over a first substrate. The imaging chip comprises a second interconnect structure disposed between the second substrate and the first interconnect structure. The CMOS chip and the imaging chip are bonded together along an interface between the first interconnect structure and the second interconnect structure. In some embodiments, corresponding quench circuits and/or read circuits are arranged within the CMOS chip and coupled to the plurality of SPAD cells of the imaging chip through the first interconnect structure and the second interconnect structure. Thereby, the plurality of SPAD cells can be arranged more compactly and the fill factor is improved.

Figure 1:
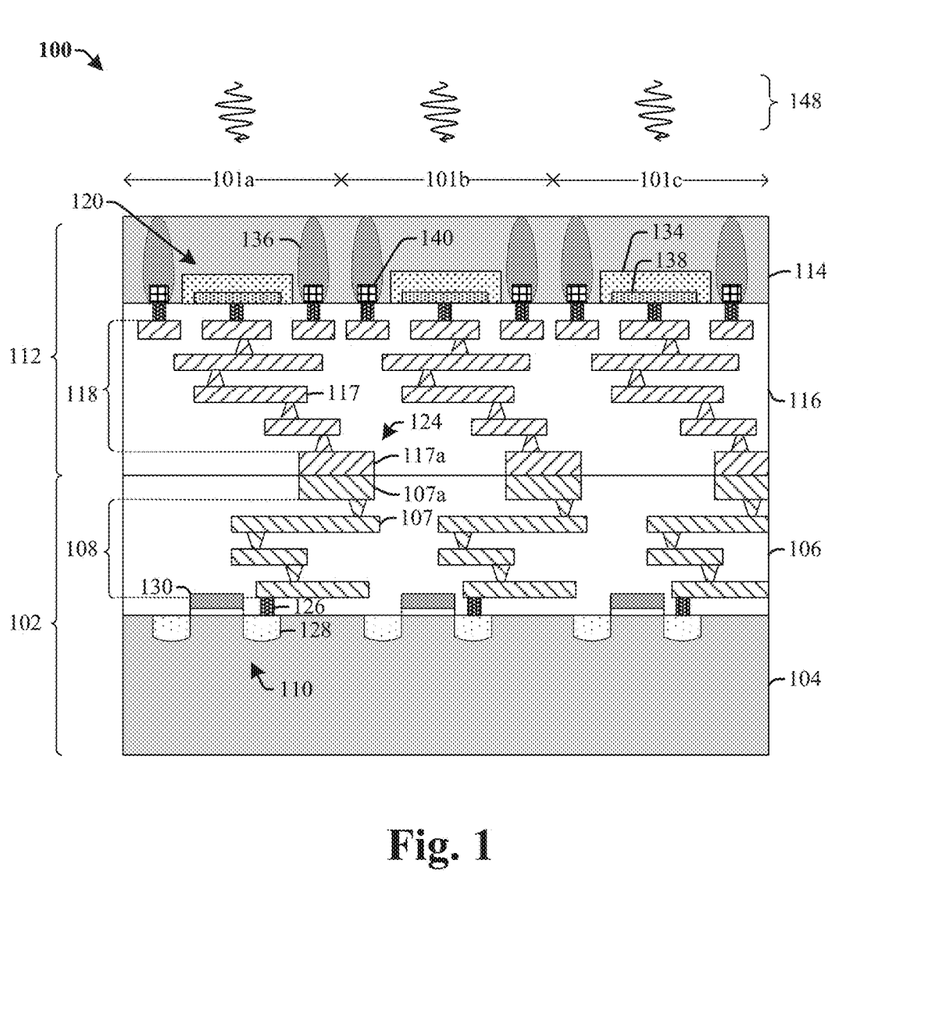
FIG. 1 illustrates a cross-sectional view of some embodiments of a stacked SPAD image sensor including a CMOS chip and an imaging chip bonded together.

FIG. 1 illustrates a cross-sectional view of some embodiments of a stacked SPAD image sensor 100 including a CMOS (complementary metal-oxide-semiconductor) chip and an imaging chip bonded together.

The stacked SPAD image sensor 100 comprises an array of pixels 101a-101c. The stacked SPAD image sensor 100 includes a CMOS chip 102 and an imaging chip 112 bonded together through a bonding structure 124. The CMOS chip 102 has a plurality of active devices 110 and the imaging chip 112 has a plurality of SPAD cells 120. By arranging SPAD cells 120 and associated active devices 110 in vertical and respectively within the imaging chip 112 and the CMOS chip 102, lateral dimensions of the pixels 101a-101c can be reduced and a fill factor of the stacked SPAD image sensor 100 can be increased.

In some embodiments, the CMOS chip 102 comprises a first interconnect structure 108 disposed over a first substrate 104. In some embodiments, the first interconnect structure 108 comprises a first plurality of metal layers 107 disposed within a first ILD layer 106. The active devices 110 are disposed within the first substrate 104. The imaging chip 112 comprises a second interconnect structure 118 disposed between the first interconnect structure 108 and a second substrate 114. The second interconnect structure 118 comprises a second plurality of metal layers 117 disposed within a second ILD layer 116.

The SPAD cells 120 are disposed within the second substrate 114. In some embodiments, the SPAD cells 120 are disposed within a front surface of the second substrate 114 that faces the second interconnect structure 118. In some embodiments, the second substrate 114 is lightly doped with dopants of a first conductivity type. The SPAD cells 120 respectively comprise a first deep well 134 and a first heavily doped layer 138 of a second conductivity type opposite to the first conductivity type. The first heavily doped layer 138 is disposed within a recess of the first deep well 134. A multiplication junction region is formed at an interface between the second substrate 114 and the first deep well 134. During operation, the SPAD cells 120 are reverse biased above their breakdown voltages, and incident photons 148 strike the stacked SPAD image sensor 100 from a back surface of the second substrate 114 to generate carriers. The photon-generated carriers move to the multiplication junction region and trigger an avalanche current that amplifies the signals generated by the photons so that they are easier to detect.

In some embodiments, the SPAD cells 120 further comprise a second deep well 136 of the first conductivity type. The second deep well 136 extends from the front surface of the second substrate 114 past the first deep well 134. The second deep well 136 is configured as a guard ring to prevent premature edge breakdown of the SPAD cells 120. In some embodiments, a second heavily doped layer 140 of the first conductivity type is disposed within a recess of the second deep well 136 arranged along the front surface of the second substrate 114. The second heavily doped layer 140 functions as one electrode of the SPAD cells 120 and can be coupled to ground.

The first heavily doped layer 138 functions as the other electrode of the SPAD cells 120 and can be coupled to the second plurality of metal layers 117 and further coupled to the active devices 110 of the first substrate 104 through the first plurality of metal layers 107. In some embodiments, the active devices 110 include active quench circuit to stop avalanche effect and reset bias of the SPAD cells 120. The active devices 110 can also include read circuit and other control or logic circuits. For example, the active devices 110 may include a transistor device having a gate structure 130 and source/drain regions 128. The first heavily doped layer 138 can be coupled to a source/drain region 128 of the transistor through a contact plug 126.

Figure 2:
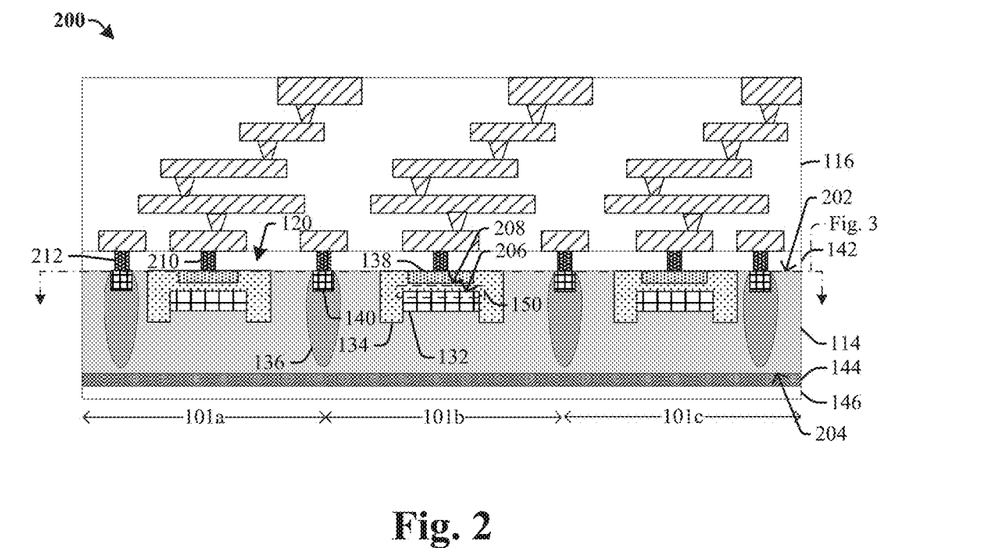
FIG. 2 illustrates a cross-sectional view of some additional embodiments of an imaging chip of a stacked SPAD image sensor.
Figure 3:
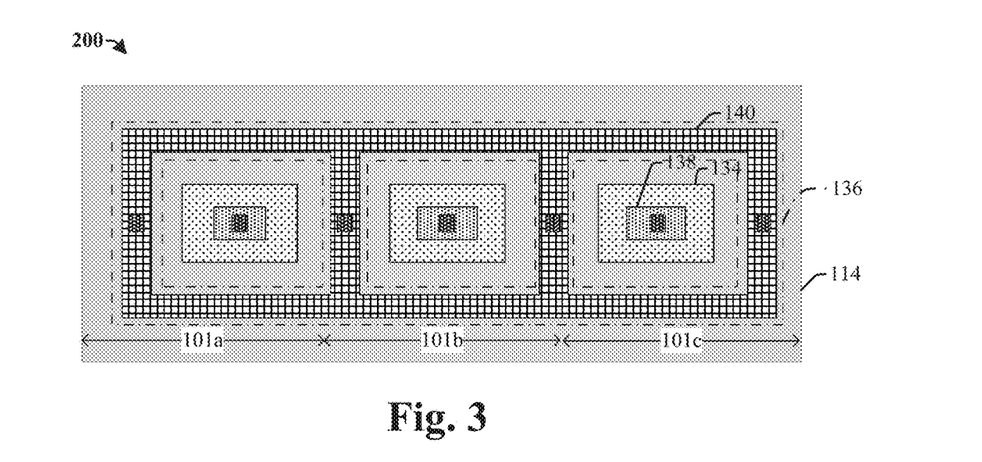
FIG. 3 illustrates a top view of some embodiments of the imaging chip of FIG. 2.

In some embodiments, the imaging chip 112 and the CMOS chip 102 are bonded together by a hybrid bond including a metal-to-metal bond and a dielectric-to-dielectric bond. The metal to metal bond (e.g. a diffusion bond) can be between a first top metal layer 107a of the first plurality of metal layers 107 and a second top metal layer 117a of the second plurality of metal layers 117. The dielectric-to-dielectric bond can be between the first ILD layer 106 and the second ILD layer 116 such that the first ILD layer 106 and the second ILD layer 116 are in direct contact with one another. The first and second top metal layers 107a, 117a function as a pair of bonding pads and can include re-distribution layers (RDLs). In some embodiments, the dielectric-to-dielectric bond is an oxide-to-oxide bond FIG. 2 illustrates a cross-sectional view of some additional embodiments of an imaging chip 200 of a stacked SPAD image sensor. FIG. 3 illustrates a top view of some embodiments of the imaging chip 200 of FIG. 2.

As shown in FIG. 2, the imaging chip 200 comprises pixels 101a-101c respectively comprising SPAD cells 120 disposed within a second substrate 114. In some embodiments, the SPAD cells 120 are disposed within a front surface 202 of the second substrate 114 and respectively comprise a first doped layer 132 of a first conductivity type, a first deep well 134 of a second conductivity type surrounding an upper surface 206 of the first doped layer 132 and a first heavily doped layer 138 of the second conductivity type disposed within a recess of an upper surface 208 of the first deep well 134. The first heavily doped layer 138 is also referred as a third doped layer. A multiplication junction 150 is formed at an interface between with the first doped layer 132 and the first deep well 134.

In some embodiments, the SPAD cells 120 may further comprise a second deep well 136 of the first conductivity type and a second heavily doped layer 140 of the first conductivity type is disposed within a recess of the second deep well 136 arranged along the front surface 202. The second heavily doped layer 140 is also referred as a fourth doped layer. The second deep well 136 may extend within the second substrate 114 to a position below the first deep well 134. In some embodiments, the second deep well 136 may extend through the second substrate 114 (e.g., to a back surface of the second substrate 114 opposite the front surface 202).

In some embodiments, the second substrate 114 can have a same conductivity type with the first doped layer 132 with a less doping concentration. For example, the second substrate 114, the first doped layer 132, the second deep well 136 and the second heavily doped layer 140 can be p-type while the first deep well 134 and the first heavily doped layer 138 can be n-type. In some other embodiments, the second substrate 114 can have a conductivity type opposite to that of the first doped layer 132 and separated from the first doped layer 132 by a lightly doped deep well (not shown) having a same doping type with the first doped layer. For example, the second substrate 114, the first deep well 134 and the first heavily doped layer 138 can be p-type while the first doped layer 132, the second deep well 136 and the second heavily doped layer 140 can be n-type. The lightly doped deep well is also n-type with a doping concentration less than that of the first doped layer 132. It is appreciated by a person with ordinary skill in the art that semiconductor layers discussed above and in subsequent contents can have doping types reversed from the examples provided.

A cross-sectional view of the first deep well 134 can be an "H" shape with the first heavily doped layer 138 disposed within an upper recess (i.e., a recess within the front surface of the second substrate 114) and the first doped layer 132 within a lower recess. In some embodiments, the first deep well 134 has a bottom surface extended to a position lower than a bottom surface of the first doped layer 132. In some embodiments, the stacked SPAD image sensor 100 further comprises a high-k dielectric layer 144 and/or an anti-reflective coating (ARC) layer 146 disposed over the back surface 204 of the second substrate 114, configured to facilitate transmissions of the incident photons 148 from the back surface to the SPAD cells 120.

A first contact plug 210 and a second contact plug 212 are respectively disposed on the first heavily doped layer 138 and the second heavily doped layer 140 within a dielectric layer 142. In some embodiments, the first contact plug 210 and the second contact plug 212 can comprise tungsten (W) or metal compound comprising tungsten. The first contact plug 210 and the second contact plug 212 can be respectively coupled to a ground and a plurality of metal layers 117 within an ILD layer 116.

As shown in FIG. 3, the second deep well 136 and the second heavily doped layer 140 are disposed at a peripheral region of the first deep well 134. The first deep well 134 surrounds the first heavily doped layer 138 and the first doped layer 132. In some embodiments, the second heavily doped layer 140 is a continuous layer providing a common node for the pixels 101*a*-101*c* as shown in FIG. 2 and FIG. 3. In other embodiments, the second heavily doped layer 140 comprises discrete rings for the pixels 101*a*-101*c*.

Figure 4:
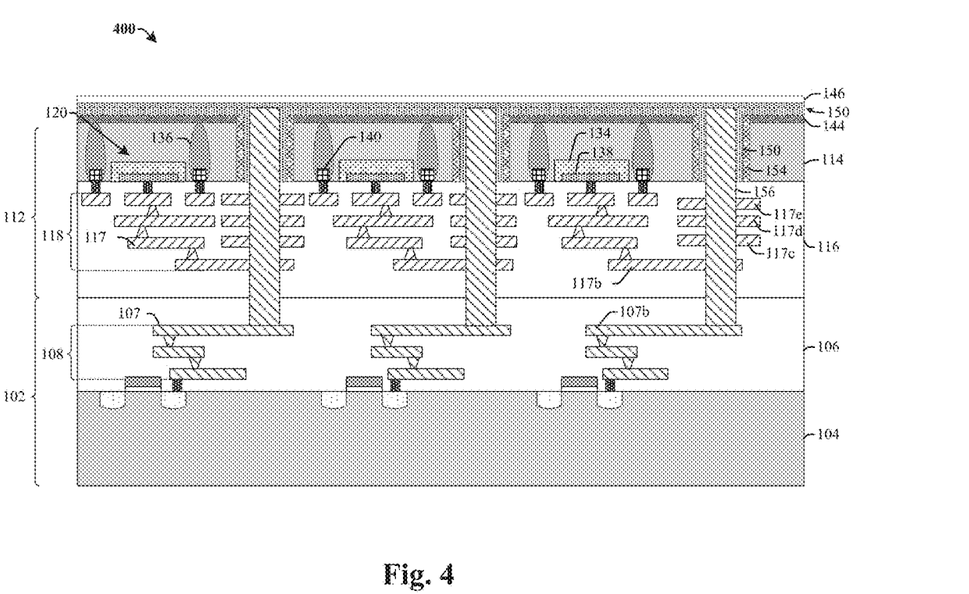
FIG. 4 illustrates a cross-sectional view of some additional embodiments of a stacked SPAD image sensor including a CMOS chip and an imaging chip bonded together.

FIG. 4 illustrates a cross-sectional view of some additional embodiments of a stacked SPAD image sensor 400 including a CMOS chip and an imaging chip bonded together.

The stacked SPAD image sensor 400 comprises a CMOS chip 102 having a plurality of CMOS devices 110 and an imaging chip 112 having a plurality of SPAD cells 120. In some embodiments, the CMOS chip 102 comprises a first interconnect structure 108 disposed over a first substrate 104. The first interconnect structure 108 comprises a first plurality of metal layers 107 disposed within a first ILD layer 106. The CMOS devices 110 are disposed within the first substrate 104.

The imaging chip 112 comprises a second interconnect structure 118 disposed between the first interconnect structure 108 and a second substrate 114. The second interconnect structure 118 comprises a second plurality of metal layers 117 disposed within a second ILD layer 116. In some embodiments, the stacked SPAD image sensor 400 further comprises a high-k dielectric layer 144, a nitride layer 150, and/or an anti-reflective coating (ARC) layer 146 disposed over a back surface of the second substrate 114.

In some embodiment, the imaging chip 112 and the CMOS chip 102 are bonded together by a dielectric-to-dielectric bond at an interface of the first ILD layer 106 and the second ILD layer 116. A TOV (through oxide via) bond structure 156 is disposed within the imaging chip 112 and the CMOS chip 102. In some embodiments, the TOV bond structure 156 connects a metal layer 107*b* within the first ILD layer 106 and another metal layer 117*b* within the second ILD layer 116. In some embodiments, the TOV bond structure 156 extends through the second substrate 114 to provide a signal access point along the back surface of the second substrate 114 (e.g., by way of a solder bond or micro-bump). In some embodiments, an upper surface of the TOV bond structure 156 may be exposed by an overlying opening within the ARC layer 146. In other embodiments, the TOV bond structure 156 may be coupled to a conductive redistribution layer (not shown) disposed along the back surface of the second substrate 114. The conductive redistribution layer provides routing to an exposed bonding area that is laterally offset from the TOV bond structure 156. In some embodiments, the nitride layer 150 surrounds the TOV bond structure 156, protect and prevent a metal material of the TOV structure 156 from diffusing into neighboring dielectric or other materials.

Within the imaging chip 112, the TOV bond structure 156 can be surrounded by an oxide film 154 disposed along a trench within the second substrate 114. In some embodiments, the nitride layer 150 may be arranged within the trench at locations that are between the oxide film 154 and the TOV bond structure 156. In some embodiments, the nitride layer 150 may also cover an upper surface of the TOV bond structure 156. The TOV bond structure 156 may also be connected to some other metal layers 117*c*, 117*d* and 117*e* of the second plurality of metal layers 117, to provide support to the TOV bond structure 156.

FIGS. 5-11 illustrate some embodiments of cross-sectional views 500-1100 showing a method of forming a stacked SPAD image sensor including a CMOS chip and an imaging chip bonded together.

Figure 5:
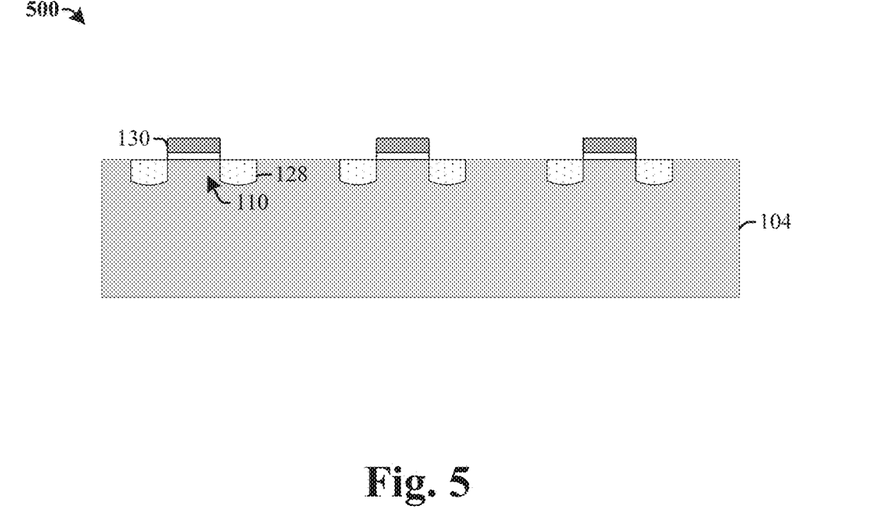
FIGS. 5-11 illustrate some embodiments of cross-sectional views showing a method of forming a stacked SPAD image sensor including a CMOS chip and an imaging chip bonded together.

As shown in cross-sectional view 500 of FIG. 5, a first substrate 104 is provided. A plurality of active devices 110 are formed within the first substrate 104. In various embodiments, the first substrate 104 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the plurality of active devices 110 may include transistors formed by depositing a gate structure 130 over the first substrate 104 and forming source/drain regions 128 by implantation or epitaxial growth.

Figure 6:
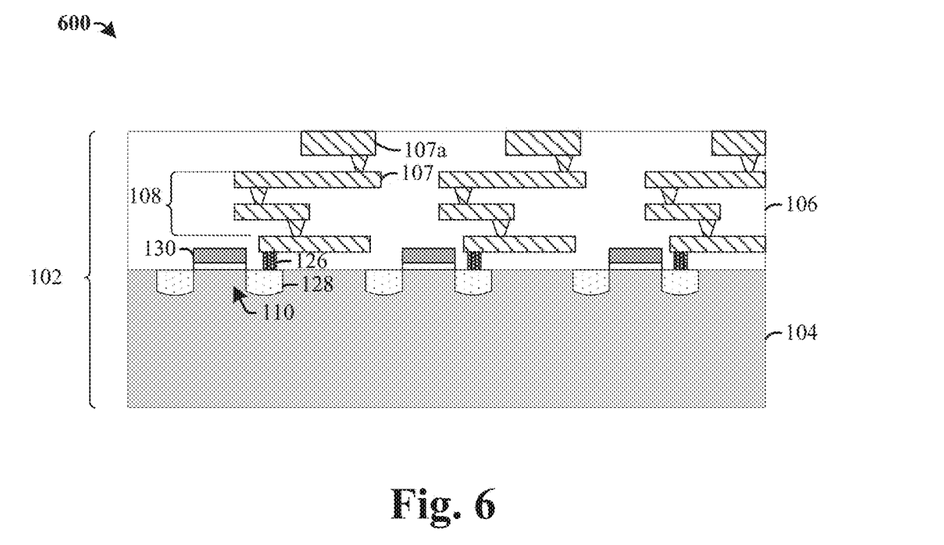

As shown in cross-sectional view 600 of FIG. 6, a first interconnect structure 108 is formed over the first substrate 104, to form a CMOS chip 102. In some embodiments, the first interconnect structure 108 may be formed by forming a first ILD layer 106, which comprises one or more layers of ILD material, over a front surface of the first substrate 104. The first ILD layer 106 is subsequently etched to form via holes and/or metal trenches. The via holes and/or metal trenches are then filled with a conductive material to form the first plurality of metal layers 107. In some embodiments, the first ILD layer 106 may be deposited by a physical vapor deposition technique (e.g., PVD, CVD, etc.). The first plurality of metal layers 107 may be formed using a deposition process and/or a plating process (e.g., electroplating, electroless plating, etc.). In various embodiments, the first plurality of metal layers 107 may comprise tungsten, copper, or aluminum copper, for example. In some embodiments, a first top metal layer 107*a* of the first plurality of metal layers 107 has an upper surface aligned with an upper surface of the first ILD layer 106.

Figure 7:
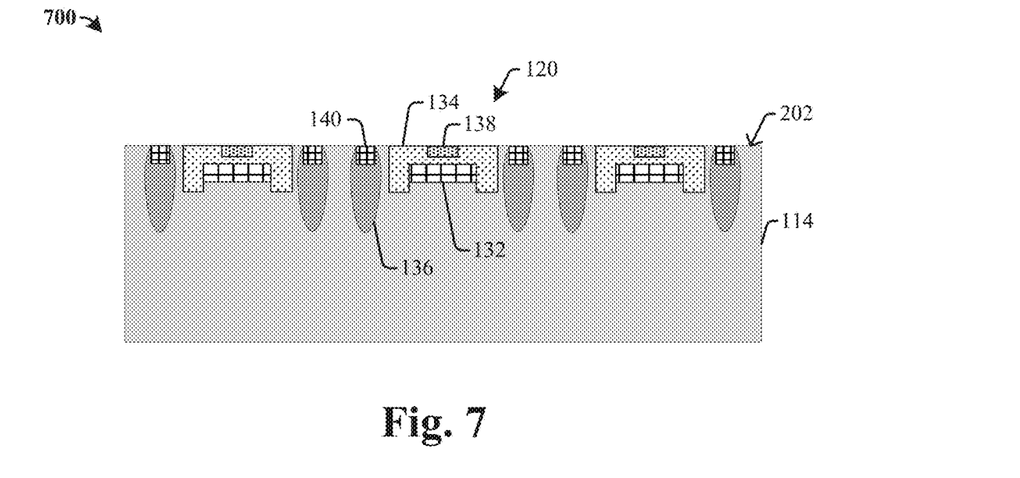

As shown in cross-sectional view 700 of FIG. 7, a second substrate 114 is provided. A plurality of SPAD cells 120 are formed within the second substrate 114. In some embodiments, the second substrate 114 can be a bulk semiconductor wafer having a first conductivity type at a first doping concentration. For example, substrate can be a silicon wafer that is lightly doped with a p-type dopant, or can be lightly doped with a p-type dopant. The substrate can be implemented as a bulk silicon wafer substrate, a binary compound substrate (e.g., GaAs wafer), a ternary compound substrate (e.g., AlGaAs), or higher order compound wafers, among others. Further, the second substrate 114 can also include non-semiconductor materials such as oxide in silicon-on-insulator (SOI), partial SOI substrate, polysilicon, amorphous silicon, or organic materials, among others. In some embodiments, the second substrate 114 can include multiple wafers or dies which are stacked or otherwise adhered together.

In some embodiments, the SPAD cells 120 are formed by forming a series of doped layers. For example, the SPAD cells 120 may be formed by forming a first doped layer 132 of a first conductivity type, a first deep well 134 of a second conductivity type surrounding upper surface and sidewall surface of the first doped layer 132, a second deep well 136 of the first conductivity type at a peripheral region of the first deep well 134, a first heavily doped layer 138 of the second conductivity type within a recess of an upper surface of the first deep well 134, and a second heavily doped layer 140 of the first conductivity type within a recess of an upper surface of the second deep well 136. The first heavily doped layer 138 and the second heavily doped layer 140 function as electrodes of the SPAD cells 120. The first deep well 134 separates the first doped layer 132 and the first heavily doped layer 138, and a multiplication junction is formed at an interface between with the first doped layer 132 and the first deep well 134.

The first doped layer 132, the first deep well 134, the second deep well 136, the first heavily doped layer 138 and the second heavily doped layer 140 can respectively be formed by implantation or epitaxial growth. For example, in some embodiments, p-type dopants (e.g., boron) are implanted as a first selective implantation (i.e., a masked implantation) into a front surface 202 of the second substrate 114 to form the first doped layer 132. Then a trench is etched corresponding to positions of the first deep well 134 and the later formed first heavily doped layer 138, followed by an epitaxial growth process of the first deep well 134 of n-type (e.g., phosphorous). Then a second implantation is performed to implant p-type dopants for the second deep well 136. The first heavily doped layer 138 of n-type and the second heavily doped layer 140 of p-type are subsequently formed. In some embodiments, the second substrate 114 may be selectively implanted according to a patterned masking layer (not shown) comprising photoresist. In some embodiments, reversed dopants are used to form the plurality of SPAD cells 120.

In some embodiments, the second substrate 114 can have a same conductivity type with the first doped layer 132. While in some other embodiments, the second substrate 114 can have a conductivity type opposite to that of the first doped layer. A third deep well of the same conductivity type with the first doped layer 132 can be formed using implantation from the front surface 202 of the second substrate to a position within the second substrate 114, surrounding and being deeper than the first deep well 134 and the second deep well 136. The third deep well has a doping concentration smaller than the first doped layer 132.

Figure 8:
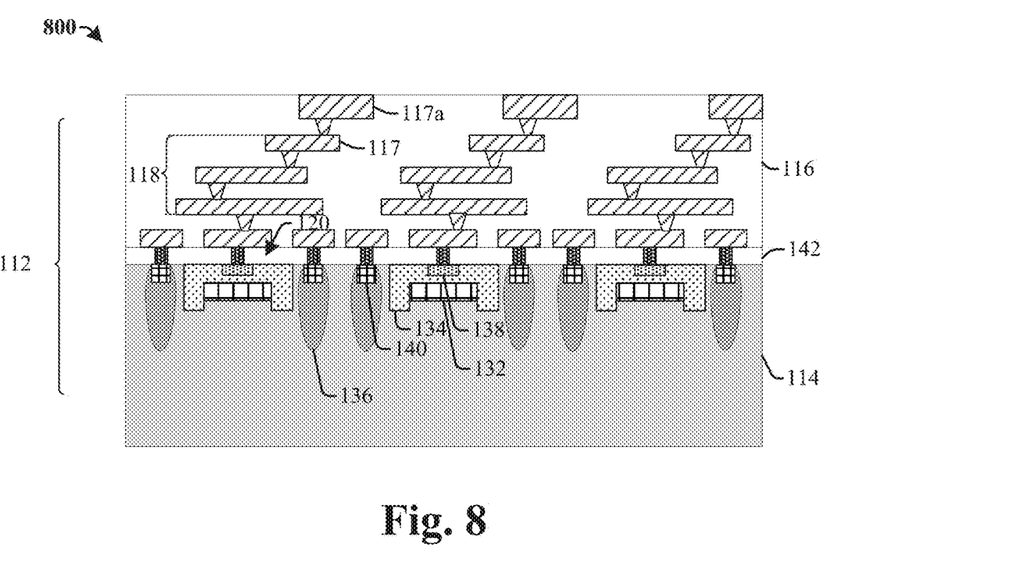

As shown in cross-sectional view 800 of FIG. 8, contact plugs are formed for the first heavily doped layer 138 and the second heavily doped layer 140. In some embodiments, the contact plugs may be formed by forming a dielectric layer 142 over the front surface 202 of the second substrate 114. The dielectric layer 142 is subsequently etched to form via holes and/or metal trenches. The via holes and/or metal trenches are then filled with a conductive material to form the contact plugs. In some embodiments, the contact plugs may comprise tungsten, copper, or aluminum copper, for example. A second interconnect structure 118 is formed over the second substrate 114, forming an imaging chip 112. In some embodiments, the second interconnect structure 118 may be formed by forming a second ILD layer 116, which comprises one or more layers of ILD material, over the dielectric layer 142. The second ILD layer 116 is subsequently etched to form via holes and/or metal trenches. The via holes and/or metal trenches are then filled with a conductive material to form the first plurality of metal layers 117. In some embodiments, the second ILD layer 116 may be deposited by a physical vapor deposition technique (e.g., PVD, CVD, etc.). The second plurality of metal layers 117 may be formed using a deposition process and/or a plating process (e.g., electroplating, electro-less plating, etc.). In various embodiments, the second plurality of metal layers 117 may comprise tungsten, copper, or aluminum copper, for example. In some embodiments, a second top metal layer 117a of the second plurality of metal layers 117 has an upper surface aligned with an upper surface of the second ILD layer 116.

Figure 9:
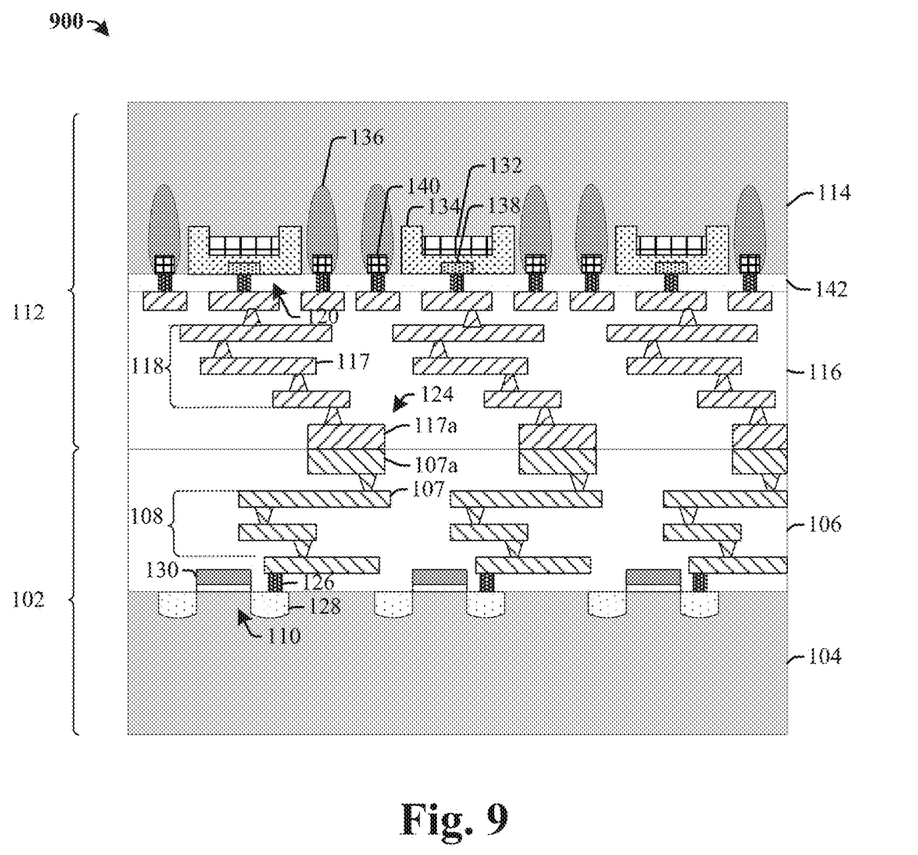

As shown in cross-sectional view 900 of FIG. 9, the imaging chip 112 is bonded to the CMOS chip 102. In some embodiments, the bonding process may form a hybrid bond including a metal-to-metal bond and a dielectric-to-dielectric bond. The first top metal layer 107a and the second top metal layer 117a can be bonded together in direct. The first ILD layer 106 and the second ILD layer 116 can abut one another to define a dielectric-to-dielectric bond of the hybrid bond. In some embodiments, the dielectric-to-dielectric bond is an oxide-to-oxide bond. In some other embodiments, the bonding process may use an intermediate bonding oxide layer (not shown) arranged between the first ILD layer 106 and the second ILD layer 116. Through the bonding, the plurality of SPAD cells 120 are correspondingly coupled to the plurality of active devices 110 through the first interconnect structure 108 and the second interconnect structure 118.

Figure 10:
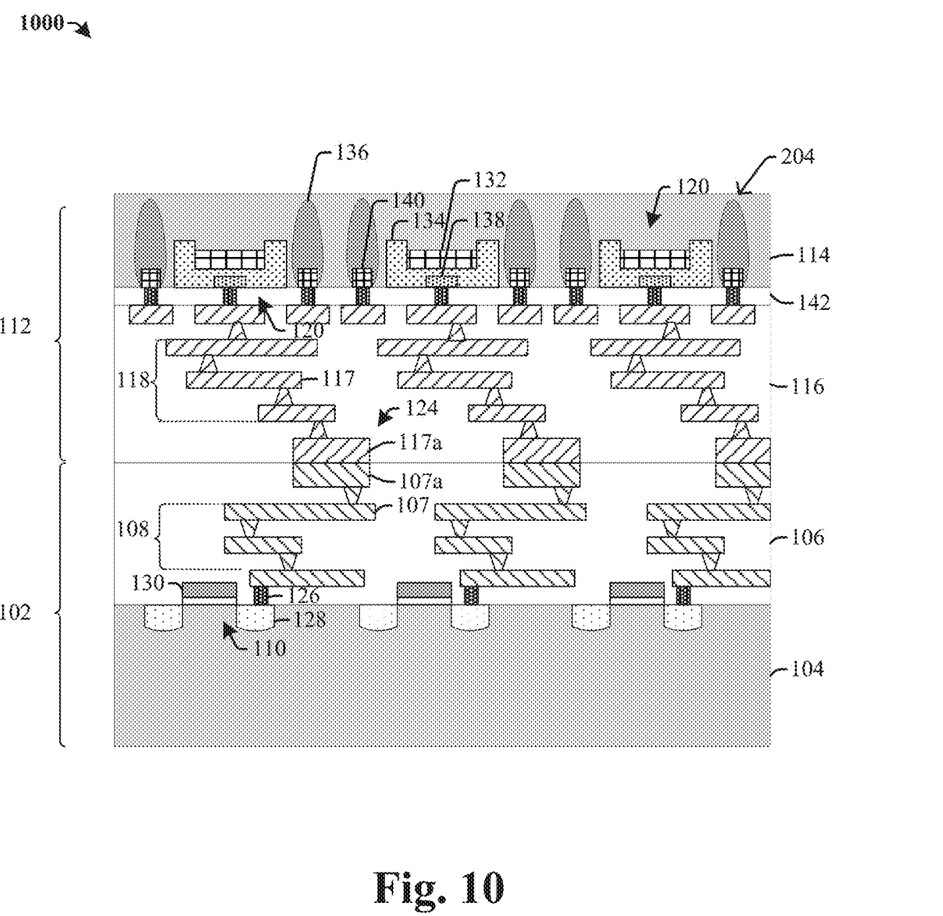

As shown in cross-sectional view 1000 of FIG. 10, a thickness of the bonded imaging chip 112 is reduced. Thinning the second substrate 114 allows incident radiations pass through a back surface 204 of the second substrate 114 to arrive the SPAD cells 120. In some embodiments, the second substrate 114 may be thinned by etching the back surface 204 of the second substrate 114. In other embodiments, the second substrate 114 may be thinned by mechanical grinding the back surface 204 of the second substrate 114. In some embodiments, the second substrate 114 may be thinned such that the second deep well 136 is exposed. While in other embodiments, the second deep well 136 is not exposed as shown in FIG. 10.

Figure 11:
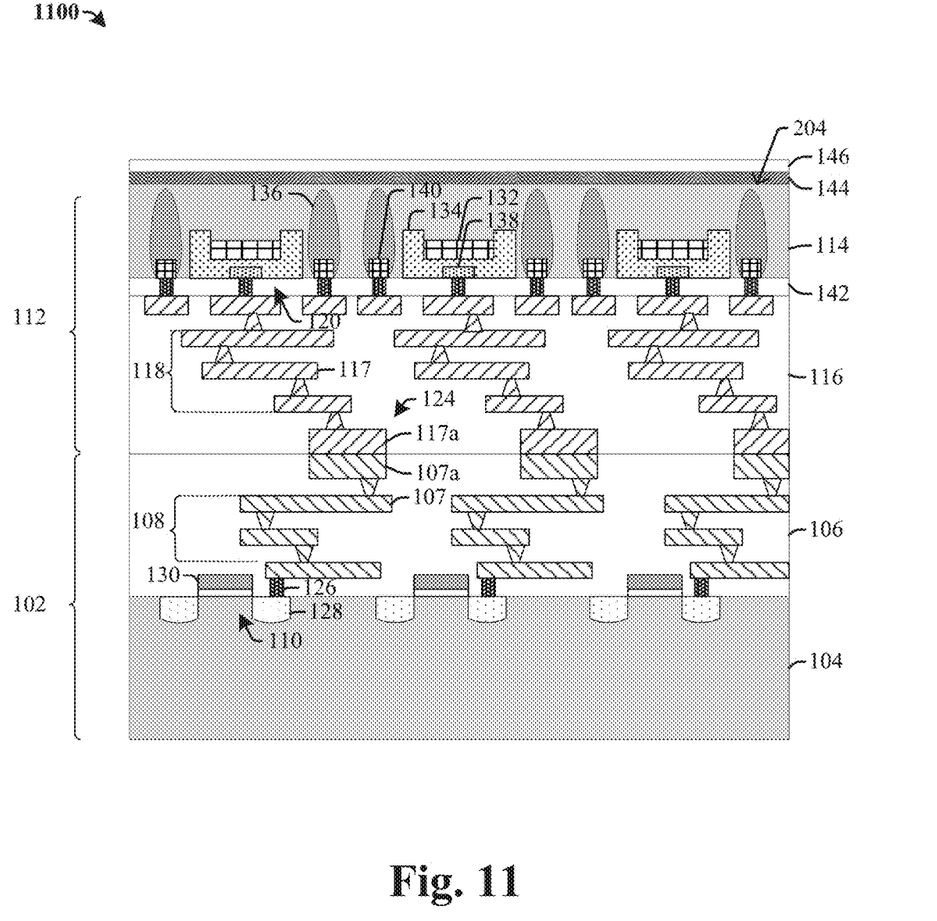

As shown in cross-sectional view 1100 of FIG. 11, a high-k dielectric layer 144 is formed over the back surface 204 of the second substrate 114. An anti-reflective coating (ARC) layer 146 can be formed over the high-k dielectric layer 144. In some embodiments, the high-k dielectric layer 144 and the ARC layer 146 may be deposited using a physical vapor deposition technique. Though not shown in the figures, in some embodiments, a plurality of color filters can be formed over the back surface 204 of the second substrate 114. In some embodiments, the plurality of color filters may be formed by forming a color filter layer and patterning the color filter layer. The color filter layer is formed of a material that allows for the transmission of radiation (e.g., light) having a specific range of wavelength, while blocking light of wavelengths outside of the specified range. Further, in some embodiments, the color filter layer is planarized subsequent to formation. A plurality of micro-lenses can also be formed over the plurality of color filters. In some embodiments, the plurality of micro-lenses may be formed by depositing a micro-lens material above the plurality of color filters (e.g., by a spin-on method or a deposition process). A micro-lens template (not shown)

having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses is then formed by selectively etching the micro-lens material according to the micro-lens template.

Figure 12:
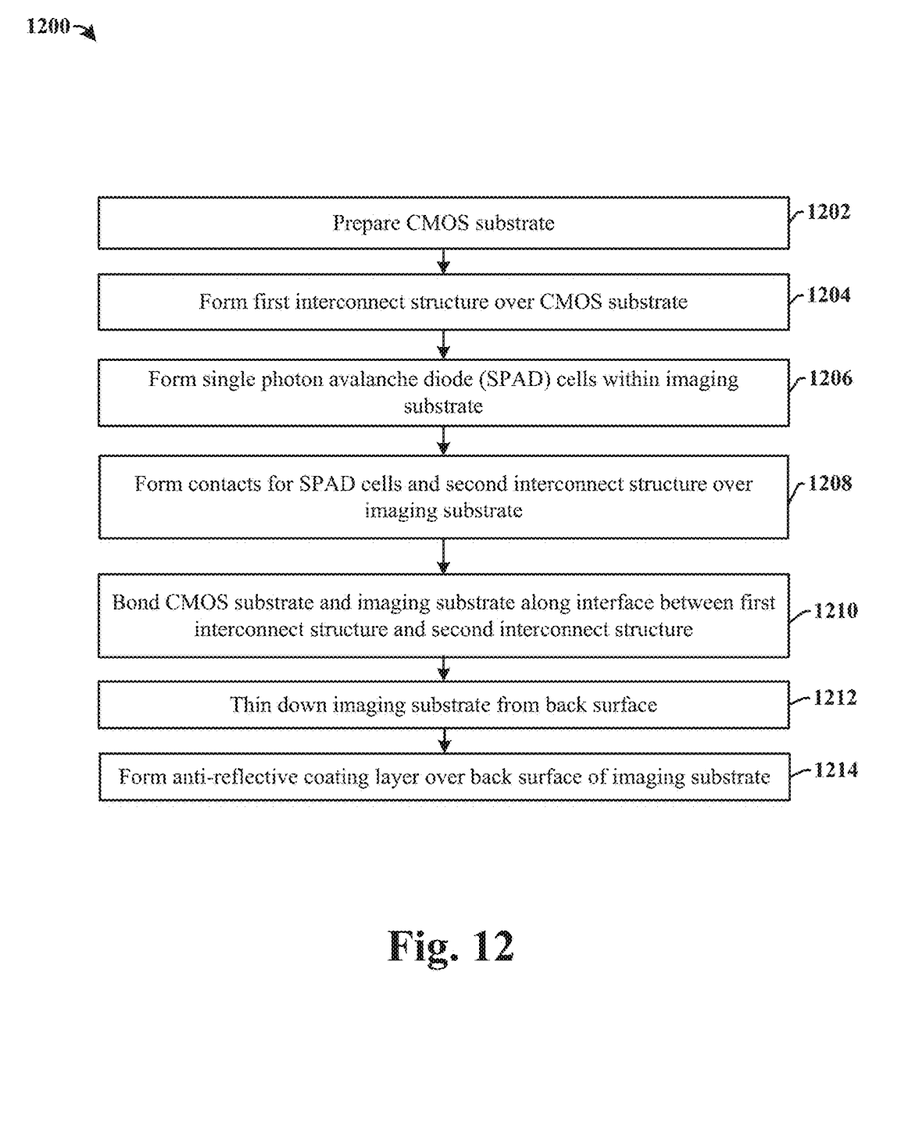
FIG. 12 illustrates a flow diagram of some embodiments of a method of forming a stacked SPAD image sensor including a CMOS chip and an imaging chip bonded together.

FIG. 12 illustrates a flow diagram of some additional embodiments of a method 1200 of a stacked SPAD image sensor including a CMOS chip and an imaging chip bonded together.

While disclosed method 1200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At 1202, a first substrate is prepared. A plurality of devices, including CMOS transistors or diodes for example, is formed within the first substrate. FIG. 5 illustrates a cross-sectional view corresponding to some embodiments corresponding to act 1202.

At 1204, a first interconnect structure including a first plurality of metal layers within a first ILD layer is formed over the first substrate to form a CMOS chip. FIG. 6 illustrates a cross-sectional view corresponding to some embodiments corresponding to act 1204.

At 1206, a second substrate is prepared. A plurality of SPAD cells are formed within the second substrate. In some embodiments, a series of implantation processes and/or epitaxial growth processes are performed into a front surface of the second substrate. In some embodiments, the dopant species may comprise a p-type dopant and an n-type dopant for varies doped layers. FIG. 7 illustrates a cross-sectional view corresponding to some embodiments corresponding to act 1206.

At 1208, contacts are formed for the plurality of SPAD cells. In some embodiments, the contacts are formed on heavily doped regions of the SPAD cells and may comprise tungsten or copper. A second plurality of interconnect structure are formed on the front surface of the second substrate over the SPAD cells to form an imaging chip. FIG. 8 illustrates a cross-sectional view corresponding to some embodiments corresponding to act 1208.

At 1210, the CMOS chip is bonded to the imaging chip. A first top metal layer of the first plurality of metal layers and a second top metal layer of the second plurality of metal layers can be bonded together through a metal-to-metal bond. Thus, SPAD cells of the imaging chip are respectively coupled to active devices of the CMOS chip through the metal-to-metal bond. FIG. 9 illustrates a cross-sectional view corresponding to some embodiments corresponding to act 1210.

At 1212, the second substrate is thinned by removing material from a back surface of the second substrate. FIG. 10 illustrates a cross-sectional view corresponding to some embodiments corresponding to act 1212.

At 1214, an anti-reflective coating (ARC) layer is formed over the back surface of the second substrate. In some embodiments, color filters and micro-lenses may be formed over the back surface of the second substrate. FIG. 11 illustrates a cross-sectional view corresponding to some embodiments corresponding to act 1214.

Therefore, the present disclosure relates to a stacked SPAD image sensor comprising a CMOS chip and an imaging chip bonded together, to improve the fill factor of the SPAD image sensor, and an associated method of formation. In some embodiments, corresponding quench circuits and/or read circuits are arranged within the CMOS chip and coupled to the plurality of SPAD cells of the imaging chip through the bonding. Thereby, the plurality of SPAD cells can be arranged more compact and the fill factor is improved.

In some embodiments, the present disclosure relates to a stacked single photon avalanche diode (SPAD) image sensor. The stacked SPAD image sensor comprises a CMOS integrated circuit (IC) comprising a first interconnect structure disposed over a first substrate, the first substrate having CMOS devices disposed thereon. The stacked SPAD image sensor further comprises an imaging chip comprising a second interconnect structure arranged between a front surface of a second substrate and the CMOS chip. A plurality of single photon avalanche diode (SPAD) cells is disposed within the front surface of the second substrate. The CMOS chip and the imaging chip are bonded together along an interface disposed between the first interconnect structure and the second interconnect structure.

In other embodiments, the present disclosure relates to a method of forming a stacked SPAD image sensor. The method comprises forming a first interconnect structure over a first substrate and forming a plurality of SPAD cells within a front surface of a second substrate. The method further comprises forming a second interconnect structure over the front surface of the plurality of SPAD cells and bonding the second interconnect structure to the first interconnect structure.

In yet other embodiments, the present disclosure relates to a method of forming a stacked SPAD image sensor. The method comprises forming a plurality of active devices within a first substrate and forming a first interconnect structure over the first substrate. The method further comprises forming a plurality of SPAD cells within a front surface of a second substrate and forming a second interconnect structure over the front surface of the second substrate. The method further comprises bonding the first substrate and the second substrate such that the plurality of SPAD cells are correspondingly coupled to the plurality of active devices through the first interconnect structure and the second interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A stacked single photon avalanche diode (SPAD) image sensor, comprising:

a CMOS chip comprising a first interconnect structure disposed over a first substrate having CMOS devices disposed thereon; and
an imaging chip comprising a second interconnect structure arranged between a front surface of a second substrate and the CMOS chip, wherein a plurality of single photon avalanche diode (SPAD) cells are disposed within the front surface of the second substrate;
a metal-to-metal bonding structure disposed along an interface between the first interconnect structure and the second interconnect structure, wherein the metal-to-metal bonding structure includes a first re-distribution layer of the first interconnect structure in direct contact with a second re-distribution layer of the second interconnect structure; and
a dielectric-to-dielectric bonding structure disposed along the interface between the first interconnect structure and the second interconnect structure, wherein the dielectric-to-dielectric bonding structure includes a first ILD layer of the first interconnect structure in direct contact with a second ILD layer of the second interconnect structure;
wherein the plurality of SPAD cells respectively comprising:
a first doped layer of a first conductivity type disposed within the second substrate;
a first continuous deep well of a second conductivity type surrounding the first doped layer and having a doping concentration different from that of the second substrate, the second conductivity type being opposite to the first conductivity type; and
a third doped layer of the second conductivity type disposed within a recess of an upper surface of the first continuous deep well; wherein the first continuous deep well separates the first doped layer and the third doped layer.

2. The stacked SPAD image sensor of claim 1, further comprising:
a second doped layer of the first conductivity type disposed at a peripheral region of the first doped layer; and
a fourth doped layer of the first conductivity type disposed within a recess of an upper surface of the second doped layer.

3. The stacked SPAD image sensor of claim 1, wherein the first doped layer has a same conductivity type as the second substrate with a greater doping concentration than the second substrate.

4. The stacked SPAD image sensor of claim 1, wherein the plurality of SPAD cells respectively comprising: a second deep well disposed at a peripheral region of the first continuous deep well; wherein a bottom surface of the first continuous deep well is positioned within the second substrate to a depth vertically between bottom surfaces of the first doped layer and the second deep well.

5. The stacked SPAD image sensor of claim 1, wherein a bottom surface of the first continuous deep well extends into the second substrate to a depth exceeding that of a bottom surface of the first doped layer; wherein the first continuous deep well covers top and sidewall surfaces of the first doped layer.

6. The stacked SPAD image sensor of claim 4, wherein the second deep well has an elongated ellipse shape with a bottom surface positioned within the second substrate to a depth exceeding the bottom surface of the first continuous deep well.

7. A stacked single photon avalanche diode (SPAD) image sensor, comprising:

a first interconnect structure disposed over a first substrate;
a plurality of SPAD cells disposed within a front surface of a second substrate; and
a second interconnect structure disposed over the front surface of the second substrate;
wherein the first substrate and the second substrate are bonded through the first interconnect structure and the second interconnect structure;
wherein the plurality of SPAD cells respectively comprises:
a first doped layer of a first conductivity type disposed within the second substrate and away from the front surface of the second substrate;
a first continuous deep well of a second conductivity type opposite to the first conductivity type disposed on the first doped layer and having a top surface reaching the front surface of the second substrate, the first continuous deep well having a doping concentration different from that of the second substrate; and
a second deep well disposed at a peripheral region of the first continuous deep well and separated from the first continuous deep well by the second substrate;
wherein a bottom surface of the first continuous deep well is positioned within the second substrate to a depth vertically between bottom surfaces of the first doped layer and the second deep well.

8. The stacked SPAD image sensor of claim 7, wherein the first interconnect structure comprises a first plurality of metal layers within a first ILD layer and the second interconnect structure comprises a second plurality of metal layers within a second ILD layer;
wherein the first ILD layer and the second ILD layer have top surfaces respectively coplanar with top surfaces of a first re-distribution layer and a second re-distribution layer;
wherein the first ILD layer and the second ILD layer are in direct contact with one another.

9. The stacked SPAD image sensor of claim 7, wherein the first doped layer is disposed within the second substrate and away from the front surface of the second substrate.

10. The stacked SPAD image sensor of claim 7, wherein the plurality of SPAD cells comprises: a third doped layer of the second conductivity type disposed within a recess of the first continuous deep well; and a fourth doped layer of the first conductivity type disposed within a recess of the second deep well.

11. The stacked SPAD image sensor of claim 10, further comprising:
a first contact plug disposed on the third doped layer; and
a second contact plug disposed on the fourth doped layer;
wherein the first contact plug and the second contact plug comprise tungsten.

12. The stacked SPAD image sensor of claim 10, wherein the first continuous deep well and the second deep well are separated by the second substrate.

13. The stacked SPAD image sensor of claim 10, wherein the second substrate has a same conductivity type with the first doped layer.

14. The stacked SPAD image sensor of claim 10, further comprising: a third deep well of the first conductivity type using an implantation, wherein the third deep well extends from the front surface of the second substrate to a position within the second substrate; wherein the third deep well surrounds and is deeper than the first continuous deep well and the second deep well, and the third deep well has a doping concentration smaller than that of the first doped layer.

15. The stacked SPAD image sensor of claim 7, further comprising:
   a high-k dielectric layer disposed over a back surface of the second substrate.

16. The stacked SPAD image sensor of claim 15, further comprising:
   an anti-reflective coating (ARC) layer disposed over the high-k dielectric layer.

17. A stacked single photon avalanche diode (SPAD) image sensor, comprising:
   a plurality of active devices disposed within a first substrate;
   a first interconnect structure disposed over the first substrate;
   a plurality of SPAD cells disposed within a front surface of a second substrate; and
   a second interconnect structure disposed over the front surface of the second substrate;
   wherein the first substrate and the second substrate are bonded such that the plurality of SPAD cells are correspondingly coupled to the plurality of active devices through the first interconnect structure and the second interconnect structure;
   wherein the plurality of SPAD cells respectively comprises:
      a p-type doped layer within the second substrate and located away from the front surface of the second substrate; and
      a continuous n-type deep well disposed on the p-type doped layer and having a top surface reaching the front surface of the second substrate, wherein a bottom surface of the continuous n-type deep well opposite to the top surface extends into the second substrate to a depth exceeding that of a bottom surface of the p-type doped layer;
   wherein the continuous n-type deep well covers top and sidewall surfaces of the p-type doped layer.

18. The stacked SPAD image sensor of claim 17, wherein the first substrate and the second substrate are bonded by a dielectric-to-dielectric bond at an interface of a first ILD layer and a second ILD layer.

19. The stacked SPAD image sensor of claim 17, wherein the first substrate and the second substrate are bonded through a metal-to-metal bond between a first top metal layer of the first interconnect structure and a second top metal layer of the second interconnect structure.

20. The stacked SPAD image sensor of claim 17, the plurality of SPAD cells comprising:
   a p-type deep well at a peripheral region of the continuous n-type deep well, separated by the second substrate;
   a third doped n-type layer within a recess of an upper surface of the continuous n-type deep well; and
   a fourth doped p-type layer within a recess of an upper surface of the p-type deep well.

* * * * *